(12) United States Patent
Chuang et al.

(10) Patent No.: US 7,339,280 B2
(45) Date of Patent: Mar. 4, 2008

(54) SEMICONDUCTOR PACKAGE WITH LEAD FRAME AS CHIP CARRIER AND METHOD FOR FABRICATING THE SAME

(75) Inventors: Jui-Yu Chuang, Taichung (TW); Lien-Chi Chan, Taichung (TW); Chih-Ming Huang, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 10/319,211

(22) Filed: Dec. 13, 2002

(65) Prior Publication Data
US 2004/0084758 A1   May 6, 2004

(30) Foreign Application Priority Data
Nov. 4, 2002   (TW) ................ 91132464 A

(51) Int. Cl.
   *H01L 23/29*   (2006.01)
(52) U.S. Cl. .................. 257/790; 257/666; 438/124
(58) Field of Classification Search ............... 257/787, 257/790, 666, 676; 438/111, 112, 123, 124
See application file for complete search history.

(56) References Cited

U.S. PATENT DOCUMENTS

| 3,566,208 | A | * | 2/1971 | Wang |
| 4,637,130 | A | * | 1/1987 | Fujii et al. ............... 29/827 |
| 4,769,344 | A | * | 9/1988 | Sakai et al. |
| 5,057,457 | A | * | 10/1991 | Miyaharea et al. |
| 5,097,317 | A | * | 3/1992 | Fujimoto et al. |
| 5,173,762 | A | * | 12/1992 | Ota ............................. 257/666 |
| 5,331,205 | A | * | 7/1994 | Primeaux |
| 5,625,235 | A | * | 4/1997 | Takier |
| 5,698,899 | A | * | 12/1997 | Hirakawa et al. ........... 257/712 |
| 6,040,622 | A |   | 3/2000 | Wallace ..................... 257/679 |
| 6,545,332 | B2 | * | 4/2003 | Huang |
| 2002/0020906 | A1 | * | 2/2002 | Hirasawa et al. ........... 257/686 |
| 2002/0020923 | A1 | * | 2/2002 | Kanatake .................... 257/778 |

FOREIGN PATENT DOCUMENTS

| JP | 3-24752 | * | 2/1991 |
| JP | 3-66152 | * | 3/1991 |

* cited by examiner

*Primary Examiner*—S. V. Clark
(74) *Attorney, Agent, or Firm*—Peter F. Corless; Steven M. Jensen; Edwards Angell Palmer & Dodge LLP

(57) ABSTRACT

A semiconductor package with a lead frame as a chip carrier and a method for fabricating the same are provided. The lead frame includes a die pad and a plurality of leads properly spaced apart from the die pad, each lead being composed of an inner lead portion and an outer lead portion, wherein the inner lead portion is directed toward the die pad, and the outer lead portion has a terminal. At least a chip is mounted on the die pad, and a first encapsulant is formed for encapsulating the chip, die pad and inner lead portions. An injection-molded second encapsulant is formed for encapsulating the first encapsulant and outer lead portions, but exposing the terminals of the outer lead portions. The second encapsulant made by injection molding can prevent resin flash over the exposed terminals, thereby assuring electrical-connection quality of the semiconductor package.

13 Claims, 4 Drawing Sheets

SEMICONDUCTOR PACKAGE WITH LEAD FRAME AS CHIP CARRIER AND METHOD FOR FABRICATING THE SAME

FIELD OF THE INVENTION

The present invention relates to semiconductor packages and fabrication methods thereof, and more particularly, to a semiconductor package with a lead frame as a chip carrier for mounting at least a chip thereon, and a method for fabricating the semiconductor package.

BACKGROUND OF THE INVENTION

Multi-media card (MMC) packages are low-profile integrated circuit (IC) devices, in which memory chips and/or controller chips are incorporated for storing and processing multi-media data such as digital pictures and images. The memory chip and/or controller chip are/is mounted on a chip carrier (e.g. substrate) in the MMC package, so as to allow the chip or chips to be electrically connected to an external device via the chip carrier for operation.

The above MMC package is exemplified as disclosed in U.S. Pat. No. 6,040,622; as shown in FIG. 3A, a substrate 10 made of an organic material, such as a circuit board, is prepared and mounted with an encapsulation wall 11 thereon; the encapsulation wall 11 is formed with a cavity for exposing a predefined chip attach area 12 on the substrate 10, so as to allow at least a chip 13 to be disposed on the exposed chip attach area 12 and received within the cavity. Then, a plastic material 14 is filled into the cavity of the encapsulation wall 11 for encapsulating the chip 13. In another embodiment, as shown in FIG. 3B, firstly, the chip 13 is mounted on the chip attach area 12 of the substrate 10, and then, epoxy resin 15 is applied over the substrate 10 for encapsulating the chip 13; finally, a lidding process is performed to cover a lid 16 over the epoxy resin 15.

The characteristic feature of the above MMC package is to use a plurality of terminals 18 on the substrate 10 as input/output (I/O) ports, as shown in FIG. 3C, wherein the chip 13 is electrically connected to a surface of the substrate 10 by a plurality of bonding wires 17 such as gold wires, and to the terminals 18 formed on an opposing surface of the substrate 10 via conductive vias (not shown) penetrating through the substrate 10, thereby allowing the chip 13 to be electrically coupled to an external device (not shown) by means of the terminals 18 exposed to outside of the package. This structural arrangement can effectively reduce overall thickness of the package, thereby making the package more compact in size. However, the use of an organic substrate as a chip carrier would undesirably increase fabrication costs of the above MMC package. In particular, for reducing the package profile, normally complex arrangement of conductive traces is formed on a small-scale substrate, making fabrication costs for the substrate significantly increased up to around 50% of the package production costs. Moreover, the above MMC package is fabricated by complex processes; for example of batch production of the packages shown in FIG. 3B, die-bonding, wire-bonding, molding, singulation and lidding processes need to be performed, thereby increasing process complexity and costs for package fabrication.

In response to the foregoing high-cost problem, Taiwan Patent Publication No. 484222 discloses a MMC package structure with a lead frame as a chip carrier. As shown in FIG. 4, this package structure utilizes a lead frame 20 having a die pad 21 and a plurality of leads 22 arranged at one side of the die pad 21, each of the leads 22 being composed of an outer lead portion 23, a middle lead portion 24 and an inner lead portion 25, wherein the outer lead portion 23 is connected to the inner lead portion 25 via the middle lead portion 24, and the outer lead portion 23 is positioned with respect to the inner lead portion 25 by a height difference. At least a semiconductor chip 26 such as MMC chip, flash memory chip or controller chip is mounted on the die pad 21 and electrically connected to the inner lead portions 25 by a plurality of bonding wires 27 (e.g. gold wires), wire loops of which bonding wires 27 are not greater in height than the height difference between the inner lead portions 25 and the outer lead portions 23. Then, a molding process is performed; after completing the above die-bonding and wire-bonding processes, the lead frame 20 is placed in a transfer mold (not shown), and a thermosetting resin material such as epoxy resin is injected into the mold; by absorbing heat from the mold, molecules of the resin material are cross-linked and cured to form an encapsulant 28 that encapsulates the chip 26, bonding wires 27, die pad 21 and leads 22, with the outer lead portions 23 being exposed to outside of the encapsulant 28 and acting as I/O ports to be electrically connected to an external device (not shown).

However, the above lead-frame-based package structure still has significant drawbacks; one is deformation of the inner lead portions 25 to form a height difference with respect to the outer lead portions 23, thereby increasing complexity for making the lead frame 20. Moreover, the overall package structure is based on the lead frame 20 that is encapsulated by the encapsulant 28; this would increase material usage of the lead frame 20 and encapsulant 28 as well as fabrication costs of the package structure. During the molding process for forming the encapsulant 28, the outer lead portions 23 intended to be exposed normally can not be firmly clamped by the mold, making the resin material for making the encapsulant 28 may easily flash over and contaminate the outer lead portions 23 acting as I/O ports, thereby degrading quality of electrical connection between the I/O ports and external device; for removing resin flash, an extra deflash process needs to be performed and thus increases fabrication costs. Furthermore, the above package structure after fabrication may retain partial lead portions at the periphery thereof, which degrades the appearance of fabricated products and may also lead to short-circuiting problems that deteriorate reliability of the fabricated products.

Therefore, the problem to be solved herein is to provide a semiconductor package that can reduce fabrication costs, simplify fabrication processes and prevent resin flash, so as to assure reliability and electrical-connection quality of fabricated package products.

SUMMARY OF THE INVENTION

An objective of the present invention is to provide a semiconductor package with a lead frame as a chip carrier and a method for fabricating the same, which can prevent resin flash over lead terminals acting as input/output (I/O) ports of the semiconductor package, so as to assure quality of electrical connection between the lead terminals and an external device.

Another objective of the invention is to provide a semiconductor package with a lead frame as a chip carrier and a method for fabricating the same, which can simplify fabrication processes and reduce fabrication costs of the semiconductor package.

A further objective of the invention is to provide a semiconductor package with a lead frame as a chip carrier and a method for fabricating the same, which can prevent short circuit from occurrence in the semiconductor package, thereby assuring reliability of fabricated products.

In accordance with the foregoing and other objectives, the present invention proposes a semiconductor package with a lead frame as a chip carrier, comprising: a lead frame having a die pad and a plurality of leads spaced apart from the die pad by a predetermined distance, each of the leads being composed of an inner lead portion and an outer lead portion, wherein the inner lead portion is directed toward the die pad, and the outer lead portion has a terminal; at least a chip mounted on a surface of the die pad and electrically connected to the inner lead portions; a first encapsulant formed on the lead frame, for encapsulating the chip, die pad and inner lead portions; and an injection-molded second encapsulant for covering the first encapsulant and outer lead portions, allowing the terminals of the outer lead portions to be exposed to outside of the second encapsulant, whereby the injection-molded second encapsulant prevents resin flash over the exposed terminals that may be electrically connected to an external device, thereby assuring quality of the electrical connection with the external device.

The above fabricated semiconductor package provides significant benefits; one is that the second encapsulant made by injection molding can prevent resin flash over the exposed terminals of the outer lead portions. This thereby eliminates the resin-flash problem in prior art due to failure in firmly clamping outer lead portions by a mold, such that quality of electrical connection between the exposed terminals (I/O ports) and the external device can be assured for the semiconductor package according to the invention. Moreover, material usage of the lead frame and first encapsulant (not encapsulating the entire lead frame) is less in amount than that used in the prior art, thereby reducing fabrication costs of the semiconductor package. Furthermore, with the first encapsulant being encapsulated by the second encapsulant, it eliminates the concern of short circuit caused by partial lead portions retained at the peripheral of a conventional package structure, such that the fabricated semiconductor package according to the invention is free of defective appearance and the short-circuiting problem thereby assuring reliability of fabricated products.

BRIEF DESCRIPTION OF THE DRAWINGS

The present invention can be more fully understood by reading the following detailed description of the preferred embodiments, with reference made to the accompanying drawings, wherein:

FIGS. 2A to 2F are schematic diagrams showing fabrication processes for a semiconductor package according to the invention, wherein FIG. 2B is a top view of a lead frame shown in FIG. 2A.

DETAILED DESCRIPTION OF THE PREFERRED EMBODIMENTS

The preferred embodiments of a semiconductor package with a lead frame as a chip carrier and a method for fabricating the same proposed in the present invention are described with reference to FIGS. 1 and 2A-2E.

Figure 1:
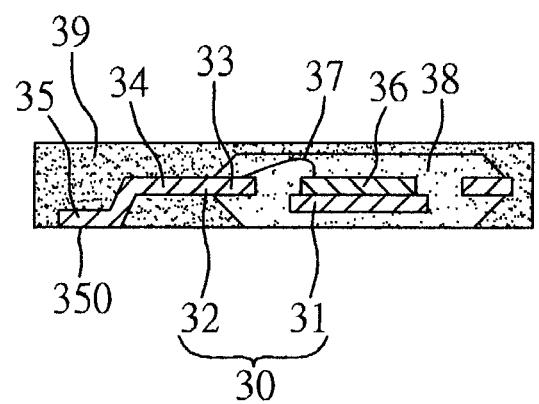
FIG. 1 is a cross-sectional view of a semiconductor package according to the invention.

As shown in FIG. 1, the semiconductor package according to the invention utilizes a lead frame 30 as a chip carrier for chip-mounting use; the lead frame 30 has a die pad 31 and a plurality of leads 32 spaced apart from the die pad 31 by a predetennined distance, and each of the leads 32 is composed of an inner lead portion 33 and an outer lead portion 34, wherein the inner lead portion 33 is directed toward the die pad 31, and the outer lead portion 34 has a terminal 35. At least a chip 36 is mounted on the die pad 31 and electrically connected to the inner lead portions 33 by a plurality of bonding wires 37. A first encapsulant 38 is formed on the lead frame 30 for encapsulating the chip 36, bonding wires 37 and inner lead portions 33, and a second encapsulant 39 made by injection molding is formed for covering the first encapsulant 38 and outer lead portions 34, allowing the terminals 35 of the outer lead portions 34 to be exposed to outside of the second encapsulant 39 and serve as input/output (I/O) ports to be electrically connected to an external device (not shown).

The above semiconductor package can be fabricated by process steps shown in FIGS. 2A to 2E.

Figure 2A:
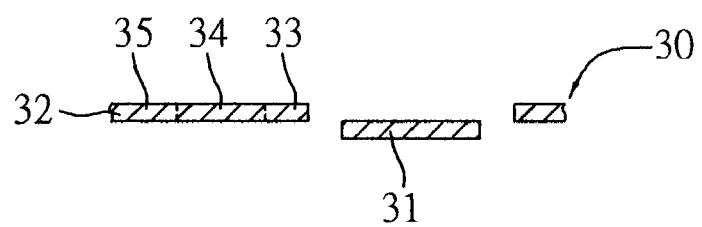
Figure 2B:
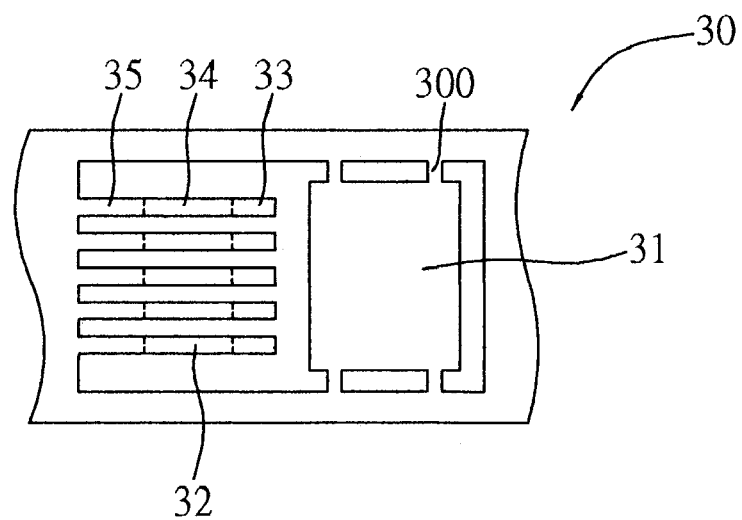

Referring to FIGS. 2A and 2B (FIG. 2B is a top view of FIG. 2A), the first step is to prepare a lead frame 30 having a die pad 31 for chip-mounting use and a plurality of leads 32 spaced apart from the die pad 31 by a predetermined distance, wherein the die pad 31 is slightly downset in elevation and positioned with respect to the leads 32 by a height difference, and the die pad 31 is connected to the lead frame 30 by a plurality of tie bars 300. Each of the leads 32 is composed of an inner lead portion 33 and an outer lead portion 34, wherein the inner lead portion 33 is directed toward the die pad 31, and the outer lead portion 34 has a terminal 35 intended to be exposed subsequently.

Figure 2C:
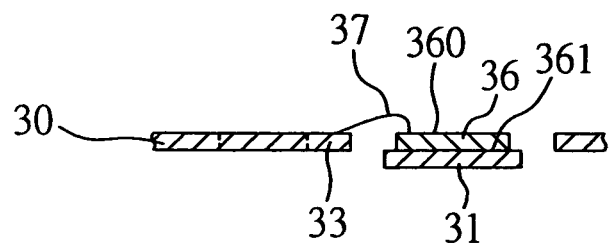

Referring to FIG. 2C, the next step is to prepare a chip 36 such as a memory chip, e.g., electrically erasable programmable read-only memory (EEPROM) or erasable programmable read-only memory (EPROM). The chip 36 has an active surface 360 where a plurality of electronic elements and circuits (not shown) are disposed, and a non-active surface 361 opposed to the active surface 360. A die-bonding process is performed to mount the chip 36 on the die pad 31 in a manner that the non-active surface 361 of the chip 36 is attached to the die pad 31 by means of an adhesive (not shown).

Then, a wire-bonding process is carried out to form a plurality of bonding wires 37 such as gold wires on the lead frame 30, wherein the bonding wires 37 are bonded to the active surface 360 of the chip 36 and the inner lead portions 33, to thereby electrically connect the chip 36 to the lead frame 30 by means of the bonding wires 37.

Figure 2D:
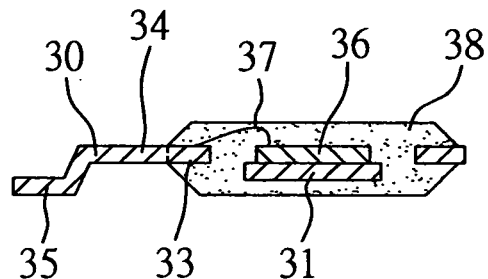

Referring to FIG. 2D, a molding process is performed to form a first encapsulant 38 on the lead frame 30. After completing the above die-bonding and wire-bonding processes, the lead frame 30 is placed in a conventional transfer mold (not shown), wherein a thermosetting resin material such as epoxy resin is injected into the mold; by absorbing heat from the mold, molecules of the resin material are cross-linked and cured to form the first encapsulant 38 that encapsulates the chip 36, bonding wires 37, die pad 31 and inner lead portions 33, with the outer lead portions 34 being exposed to outside of the first encapsulant 38. The terminals 35 of the outer lead portions 34 are deformed to be downset in elevation and form a height difference with respect to the corresponding inner lead portions 33.

Figure 2E:
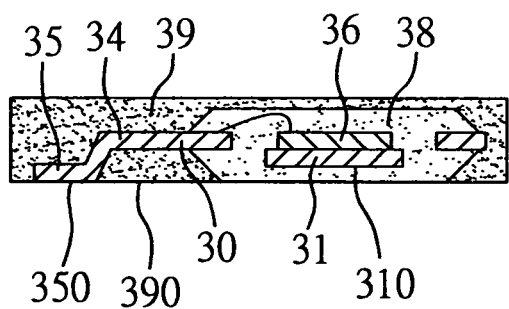

Finally, referring to FIG. 2E, an injection molding process is carried out, wherein the lead frame 30 with the first encapsulant 38 is placed in an injection mold (not shown) to form a second encapsulant 39 by a thermoplastic resin material thereon; the thermoplastic resin material may be polycarbonate ester, acrylic resin, methylene chloride or polyester. The second encapsulant 39 covers the first encapsulant 38 and the outer lead portions 34, allowing a surface 350 of the terminal 35 of each of the outer lead portions 34 to be exposed to outside of the second encapsulant 39 and level with a surface 390 of the second encapsulant 39; the exposed terminals 35 serve as 110 ports for electrically connecting the chip 36 to an external device such as a printed circuit board (PCB, not shown). This completes fabrication of the semiconductor package according to the invention.

Figure 2F:
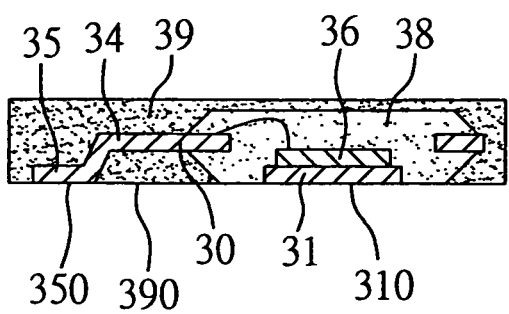
Figure 3A:
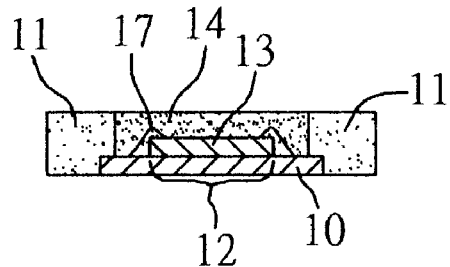
FIG. 3A (PRIOR ART) is a cross-sectional view of a semiconductor package disclosed in U.S. Pat. No. 6,040,622.
Figure 3B:
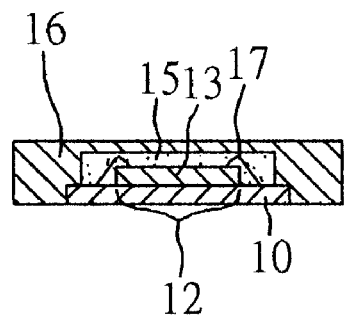
FIG. 3B (PRIOR ART) is a cross-sectional view of another semiconductor package disclosed in U.S. Pat. No. 6,040,622.
Figure 3C:
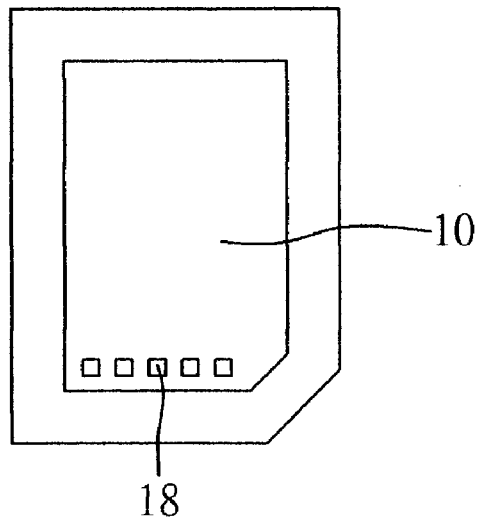
FIG. 3C (PRIOR ART) is a bottom view of the semiconductor package disclosed in U.S. Pat. No. 6,040,622.
Figure 4:
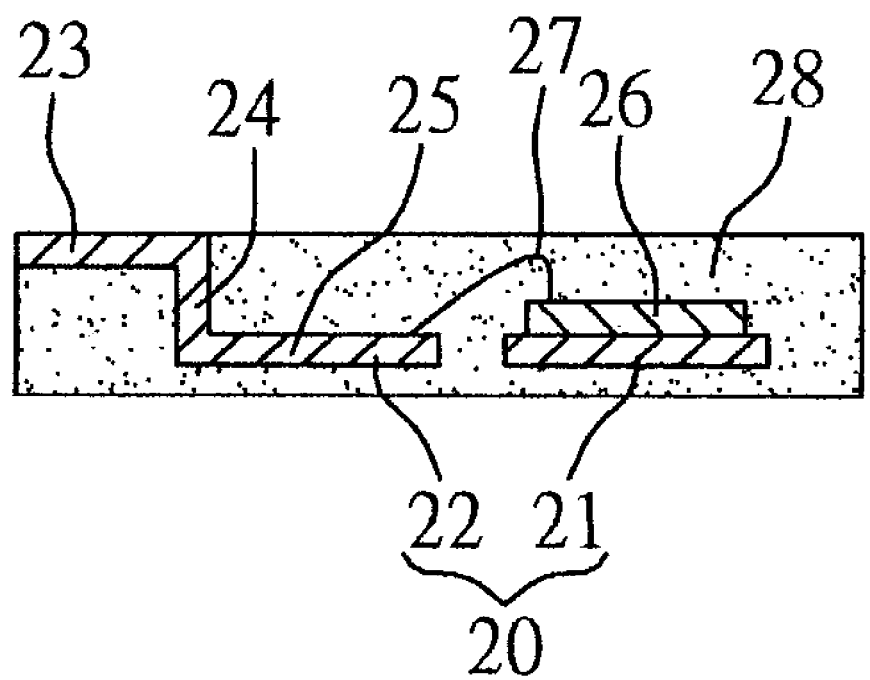
FIG. 4 (PRIOR ART) is a cross-sectional view of a semiconductor package disclosed in Taiwan Patent Publication No. 484222.

In another embodiment illustrated in FIG. 2F, a bottom surface 310 of the die pad 31 may be exposed to outside of the first and second encapsulants 38, 39, and level with the surface 390 of the second encapsulant 39 and the exposed surfaces 350 of the terminals 35 of the outer lead portions 34. This arrangement allows heat produced from the chip 36 to be dissipated via the exposed bottom surface 310 of the die pad 31, thereby improving heat dissipating efficiency of the semiconductor package.

The above fabricated semiconductor package provides significant benefits; one is that the second encapsulant 39 made by injection molding can prevent resin flash over the exposed surfaces 350 of the terminals 35 of the outer lead portions 34. This thereby eliminates the resin-flash problem in prior art due to failure in firmly clamping outer lead portions by a mold, such that quality of electrical connection between the exposed terminal surfaces 350 (I/O ports) and the external device can be assured for the semiconductor package according to the invention. Moreover, downset arrangement of the die pad 31 and terminals 35 of the outer lead portions 34 of the lead frame 30 in elevation with respect to the inner lead portions 33 is accomplished by conventional technology without increasing fabrication complexity. And, material usage of the lead frame 30 and first encapsulant 39 (not encapsulating the entire lead frame 30) is less in amount than that used in the prior art, thereby reducing fabrication costs of the semiconductor package. Furthermore, with the first encapsulant 38 being encapsulated by the second encapsulant 39, it eliminates the concern of short circuit caused by partial lead portions retained at the peripheral of a conventional package structure, such that the fabricated semiconductor package according to the invention is free of defective appearance and the short-circuiting problem thereby assuring reliability of fabricated products.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package with a lead frame as a chip carrier, comprising:

a lead frame having a die pad and a plurality of leads spaced apart from the die pad by a predetermined distance, each of the leads being composed of an inner lead portion and an outer lead portion integral with the inner lead portion, wherein the leads are all disposed on one side of the lead frame;

at least a chip mounted on a surface of the die pad and electrically connected to the inner lead portions;

a first encapsulant formed on the lead frame for encapsulating bottom portions of the chip, the die pad, and the inner lead portions and for allowing the outer lead portions to outwardly protrude from the first encapsulant; and an injection-molded second encapsulant made of a thermoplastic resin material for covering the first encapsulant and the outer lead portions protruded from the first encapsulant, allowing a surface of each of the terminals of the outer lead portions and a surface of the first encapsulant to be exposed to outside of the second encapsulant and level with a surface of the second encapsulant, whereby the injection-molded second encapsulant prevents resin flash over the exposed terminals that may be electrically connected to an external device, thereby assuring quality of the electrical connection with the external device.

2. The semiconductor package of claim 1, wherein the chip is electrically connected to the inner lead portions by a plurality of bonding wires.

3. The semiconductor package of claim 2, wherein the bonding wires are gold wires.

4. The semiconductor package of claim 1, wherein the terminals of the outer lead portions are positioned by a height difference with respect to the conesponding inner lead portions.

5. The semiconductor package of claim 1, wherein the thermoplastic resin material is selected from the group consisting of polycarbonate ester, acrylic resin, methylene chloride, and polyester.

6. The semiconductor package of claim 1, wherein a surface of the die pad opposed to the surface mounted with the chip is exposed to outside of the first and second encapsulants.

7. A method for fabricating a semiconductor package with a lead frame as a chip carrier, comprising the steps of:

preparing a lead frame having a die pad and a plurality of leads spaced apart from the die pad by a predetermined distance, each of the leads being composed of an inner lead portion and an outer lead portion integral with the inner lead portion, wherein the leads are all disposed on one side of the lead frame;

mounting at least a chip on a surface of the die pad, and electrically connecting the chip to the inner lead portions;

performing a molding process to form a first encapsulant on the lead frame for encapsulating bottom portions of the chip, the die pad, and the inner lead portions and for allowing the outer lead portions to outwardly protrude from the first encapsulant; and performing an injection molding process to form a second encapsulant for covering the first encapsulant and the outer lead portions protruded from the first encapsulant, allowing a surface of each of the terminals of the outer lead portions and a surface of the first encapsulant to be exposed to outside of the second encapsulant and level with a surface of the second encapsulant, whereby the second encapsulant made by injection molding prevents resin flash over the exposed terminals that may be electrically connected to an external device, thereby assuring quality of the electrical connection with the external device.

8. The method of claim 7, wherein the chip is electrically connected to the inner lead portions by a plurality of bonding wires.

9. The method of claim 8, wherein the bonding wires are gold wires.

10. The method of claim 7, wherein the terminals of the outer lead portions are positioned by a height difference with respect to the corresponding inner lead portions.

11. The method of claim 7, wherein the second encapsulant is made of a thermoplastic resin material.

12. The method of claim 11, wherein the thermoplastic resin material is selected from the group consisting of polycarbonate ester, acrylic resin, methylene chloride, and polyester.

13. The method of claim 7, wherein a surface of the die pad opposed to the surface mounted with the chip is exposed to outside of the first and second encapsulants.

* * * * *